US006787759B1

(12) United States Patent
Saffman

(10) Patent No.: US 6,787,759 B1
(45) Date of Patent: Sep. 7, 2004

(54) ATOMIC LITHOGRAPHY OF TWO DIMENSIONAL NANOSTRUCTURES

(75) Inventor: Mark E. Saffman, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 10/421,192

(22) Filed: Apr. 23, 2003

(51) Int. Cl.[7] .............................................. H05H 5/03

(52) U.S. Cl. .................................................... 250/251

(58) Field of Search ........................................ 250/251

(56) References Cited

U.S. PATENT DOCUMENTS 3,710,279 A * 1/1973 Ashkin ........................ 250/251
4,327,288 A * 4/1982 Ashkin et al. ............... 250/251
5,360,764 A   11/1994 Celotta et al.

OTHER PUBLICATIONS

G. Timp, et al., "Using Light as a Lens for Submicron, Neutral–Atom Lithography," Physical Review Letters, vol. 69, No. 11, Sep. 14, 1992, pp. 1636–1639.
J.J. McClelland, et al., "Laser–Focused Atomic Deposition", Science, New Series, vol. 262, Issue 5135, Nov. 5, 1993, pp. 877–880.
R. Gupta, et al., "Nanofabrication of a Two–Dimensional Array Using Laser–Focused Atomic Deposition," Applied Physics Letters, vol. 67, No. 10, Sep. 4, 1995, pp. 1378–1380.
Karl K. Berggren, et al., "Microlithography by Using Neutral Metastable Atoms and Self–Assembled Monolayers," Science, New Series, vol. 269, Issue 5228, Sep. 1, 1995, pp. 1255–1257.
Roger W. McGowan, et al., "Light Force Cooling, Focusing, and Nanometer–Scale Deposition of Aluminum Atoms," Optics Letters, vol. 20, No. 24, Dec. 15, 1995, pp. 2535–2537.
K.S. Johnson, et al., "Using Neutral Metastable Argon Atoms and Contamination Lithography to Form Nanostructures in Silicon, Silicon Dioxide, and Gold," Applied Physics Letters, vol. 69, No. 18, Oct. 28.
R. Gupta, et al., "Raman–Induced Avoided Crossings in Adiabatic Optical Potentials: Observation of /8 Spatial Frequency In the Distribution of Atoms," Physical Review Letters, vol. 76, No. 25, Jun. 17, 1996, pp. 4689–4692.
U. Drodofsky, et al., "Hexagonal Nanostructures Generated by Light Masks for Neutral Atoms," Applied Physics B, Lasers and Optics, vol. 65, 1997, pp. 755–759.
R. Younkin, et al., "Nanostructure Fabrication in Silicon Using Cesium to Pattern a Self–Assembled Monolayer," Applied Physics Letters, vol. 71, No. 9, Sep. 1, 1997, pp. 1261–1263.

(List continued on next page.)

Primary Examiner—Jack I. Berman
(74) Attorney, Agent, or Firm—Foley & Lardner LLP

(57) ABSTRACT

Atomic lithography for depositing atoms on a substrate is carried out by forming an atomic beam, and directing it toward a substrate, and providing converging laser beams above a surface of the substrate, wherein the laser beams are modulated by at least one spatial light modulator through which the laser beam passes to form at least one high intensity optical spot by interference to selectively focus the atomic beam. The optical spot and focused atomic beam can be translated in a selected pattern by appropriate control of the individual pixel elements in the spatial light modulator. An atomic lithography system that can be configured to form arbitrary two-dimensional nanostructures on a substrate may include at least one spatial light modulator and lenses positioned adjacent the at least one spatial light modulator. The lenses and the at least one spatial light modulator are configured to selectively form a high intensity optical spot to focus atoms from an atomic beam onto the substrate.

15 Claims, 4 Drawing Sheets

OTHER PUBLICATIONS

J.H. Thywissen, et al., "Using Neutral Atoms and Standing Light Waves to Form a Calibration Artifact for Length Metrology", J. Vacuum Science Technology B, vol. 16, No. 6, Nov./Dec. 1998, pp. 3841–3845.

Jabez J. McClelland, "Nanofabrication via Atom Optics," Chapter 7, Handbook of Nanostructured Materials and Nanotechnology, vol. 1, Synthesis and Processing, Hari Singh Nalwa, Ed., Academic Press, 2000, pp. 335–385.

Th. Schulze, et al., "Writing a Superlattice with Light Forces," Applied Physics B, vol. 70, 2000, pp. 671–674.

M. Mutzel, et al., "Atom Lithography with a Holographic Light Mask," Physical Review Letters, vol. 88, No. 8, Feb. 25, 2002, pp. 083601-1–083601-4.

* cited by examiner

ATOMIC LITHOGRAPHY OF TWO DIMENSIONAL NANOSTRUCTURES

FIELD OF THE INVENTION

The present invention relates generally to the field of lithography, and more particularly, to laser controlled nanolithography.

BACKGROUND OF THE INVENTION

One key for the rapid development of modern computer technology has been the constant miniaturization of electronic devices and integrated circuits. Heretofore, photolithography has been the conventional method for industrial integrated circuit production. However, it is becoming clear that photolithography has significant, if not unsurmountable challenges when feature sizes below 50 nm are required. Alternative lithographic techniques are needed.

In atomic lithography, conventional roles played by light and matter are reversed. Instead of using a solid mask to pattern a light beam, a mask of light is used to pattern a beam of neutral atoms. Previously, researchers have shown that atomic lithography can be used to pattern long thin features or strips, as shown in FIG. 1. In addition, researchers have been able to pattern an array of features, as shown in FIG. 2. Features such as those illustrated in FIGS. 1 and 2 can be formed by exposing a source of atoms, such as chromium or aluminum, from an oven to a substrate using atomic lithography.

FIG. 3 illustrates a schematic representation of a prior atomic lithography process. See, Th. Schulze, et al., "Writing a Superlattice with Light Forces," Applied Physics B, Lasers and Optics, Vol. 70, 2000, pp. 671–674. Opposing laser beams 20 and 21, which can be produced by reflecting a single laser beam back on itself, produce a transversal laser cooling of atoms near an oven 24. In addition, laser beams 25 and 26 produce a standing wave 30 above a substrate 31. Atoms from the oven 24, shown by arrows, are directed through the standing wave 30 prior to reaching the substrate 31. The transversal laser cooling collimates (i.e., lines up) the atomic beam. As a result of the focusing effect of the standing wave 30, the atoms are deposited on the surface of the substrate 31 in parallel lines 32. The linear pattern of the deposited atoms corresponds to the minima or maxima of the standing wave 30 due to the fact that the atoms are optically focused toward the minima or maxima of the standing wave.

In optical lithography, arbitrary and aperiodic patterning of atoms is produced by projecting the desired optical intensity distribution using a lens in front of the target substrate. Although atomic lithography processes have many attractive features, one major limitation is that heretofore only spatially periodic patterning has been demonstrated.

To be able to utilize atomic lithography to replace optical lithography, it thus would be necessary to be able to deposit atomic species in arbitrary patterns. It would be particularly advantageous to be able to control the position of atom spot deposition without mechanical motion. Such control would allow the application of atomic lithography to a greater range of fabrication tasks.

SUMMARY OF THE INVENTION

The present invention can be embodied in a method of depositing atoms on a substrate. The method includes forming an atomic beam, providing a laser beam above a surface of the substrate where the laser beam has a direction defined by at least one spatial light modulator through which the laser beam passes to form a high intensity optical spot by interference to selectively focus the collimated atomic beam, and synthesizing a spot that can be moved to form a two-dimensional pattern of atoms on the surface of the substrate.

The present invention can also be embodied in an atomic lithography system that can be configured to form arbitrary two-dimensional nanostructures on a substrate. The system includes spatial light modulators and lenses positioned proximate the spatial light modulators. The lenses and spatial light modulators are configured to selectively focus atoms in an atomic beam onto the substrate.

The present invention can also be embodied in an deposition system comprising means for forming an atomic beam, means for directing a laser beam above a surface of a substrate to selectively focus the atomic beam, and means for synthesizing a spot for forming a pattern of atoms on the surface of the substrate.

Further objects, features and advantages of the invention will be apparent from the following detailed description when taken in conjunction with the accompanying drawings.

DETAILED DESCRIPTION OF THE INVENTION

Figure 1:
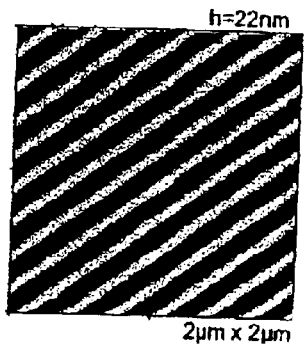
FIG. 1 is a schematic representation of long, thin features formed using conventional atomic lithography techniques.
Figure 2:
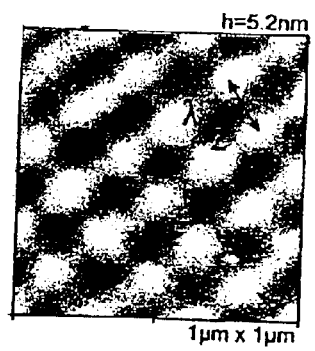
FIG. 2 is a schematic representation of an array of features formed using conventional atomic lithography techniques.
Figure 3:
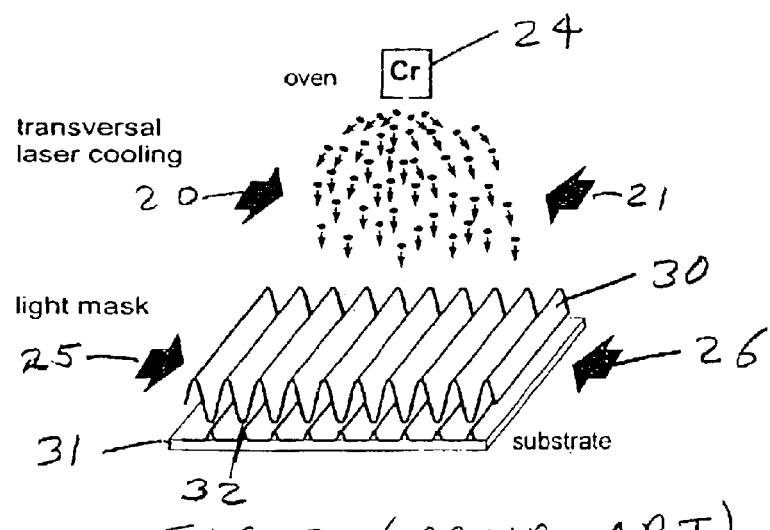
FIG. 3 is a schematic representation of a conventional atomic lithography process.
Figure 4:
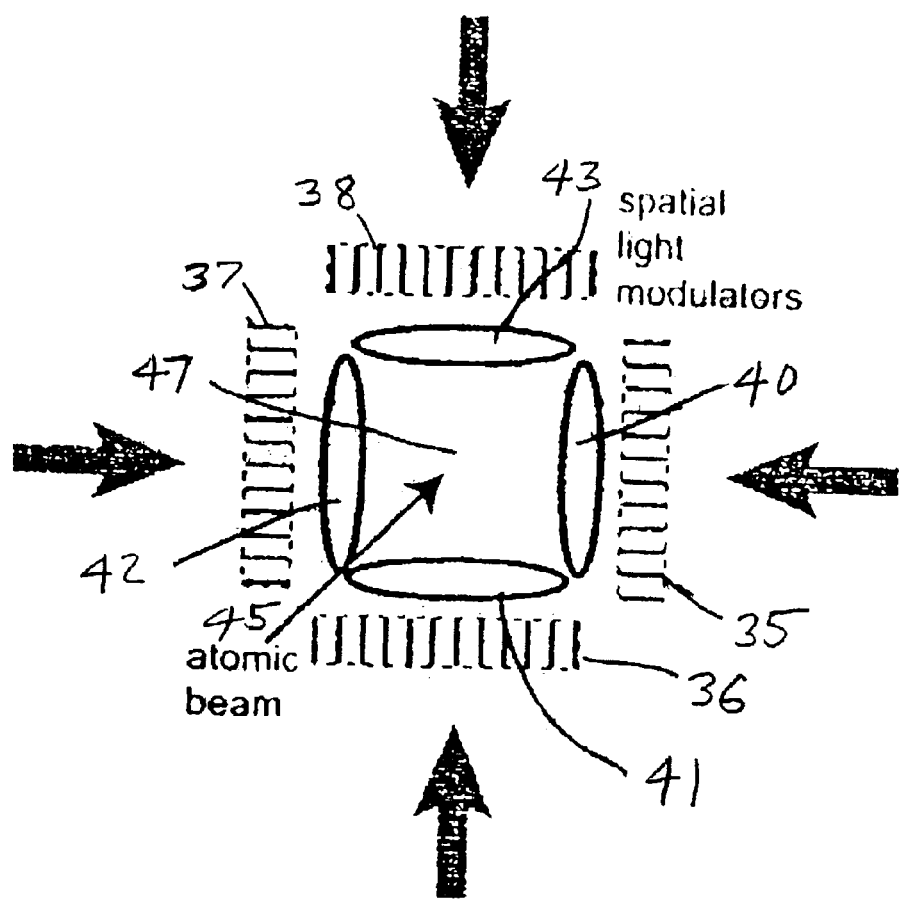
FIG. 4 is a schematic representation of spatial light modulators arranged in an atomic lithography system in accordance with an exemplary embodiment of the invention.

With reference to the drawings, FIG. 4 shows a portion of an atomic lithography system in accordance with the invention configured to control an atomic beam. In this configuration, spatial light modulators 35, 36, 37, and 38 are positioned optically ahead of lenses 40, 41, 42, and 43, respectively. The spatial light modulators 35, 36, 37, and 38 are devices which have a linear array of individual light valves which modulate light (e.g., liquid crystal modulators) and can be electronically controlled to focus atom deposition as discussed further below. The spatial light modulators 35, 36, 37, and 38 preferably can control an optical wave front over the full range of the plane (a full 360 degrees of phase modulation), allowing the position of the atom spot deposition to be precisely controlled without mechanical motion as discussed further below. Examples of spatial light modulators currently available include Cambridge Research and Instrumentation, Inc. Model SLM-128-NIR-PHS, Meadowlark Optics Model Shape Shifter, and JenOptik (Jena Germany) Model SLM-S640/12.

Using the lenses 40, 41, 42, and 43 and the spatial light modulators 35, 36, 37, and 38 surrounding an atom beam 45, almost complete coverage of a $2\pi$ angular range is obtained. To create a localized bright spot in the center of the pattern, the incident fields are imaged to a point source of circular waves. A point source creates an outgoing wave proportional to $e^{j(kr-wt)}$. Therefore, to create a spot at the center, the atomic beam region is illuminated with waves $e^{j(-kr-wt)}$ where r is the distance from the location of the bright spot.

Atoms are presented by the beam 45 at an area 47 between the lenses 41–43. The atoms can be heated or energized by an oven (not shown in FIG. 4) before being presented at the area 47. The atoms are directed or positioned through the area 47 using light passing through the lenses 41–43 and the spatial light modulators 35–38. The spatial light modulators electronically focus atom deposition as determined by a control system so that atoms can be selectively positioned on a substrate at non-periodic locations.

Figure 5:
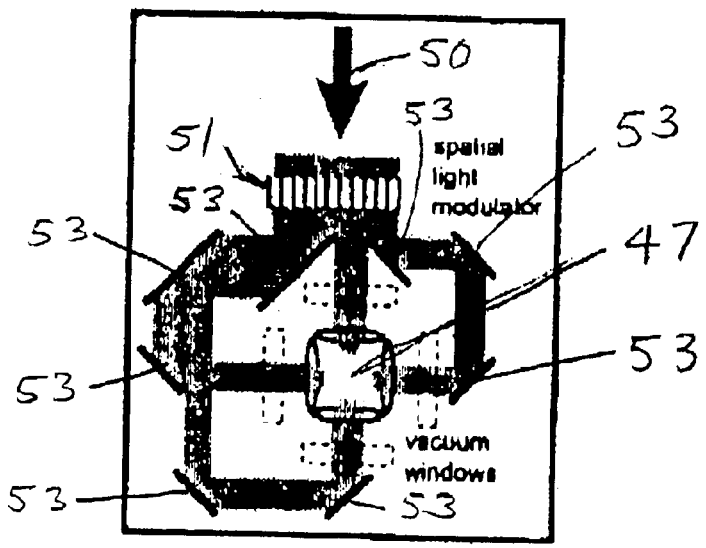
FIG. 5 is a schematic representation of beam generation by a single spatial light modulator in accordance with an exemplary embodiment of the invention.

FIG. 5 shows how a single light modulator can be used for beam generation in an atomic lithography system. A laser beam 50 passes through a one dimensional spatial light modulator 51 which directs the laser beam toward reflectors 53 which split the modulated beam into four beams that converge through the lenses 40, 41, 42 and 43 to a focus area 47. In the configuration of FIG. 5, the spatial light modulators 35, 36, 37, and 38 of FIG. 4 are replaced by vacuum windows. Sections of the single spatial light modulator 51 of FIG. 5 separately modulate the four beams that are directed by the mirrors 53 toward the focus area 47, so that the single modulator 51 effectively functions as four separate modulators.

Figure 6:
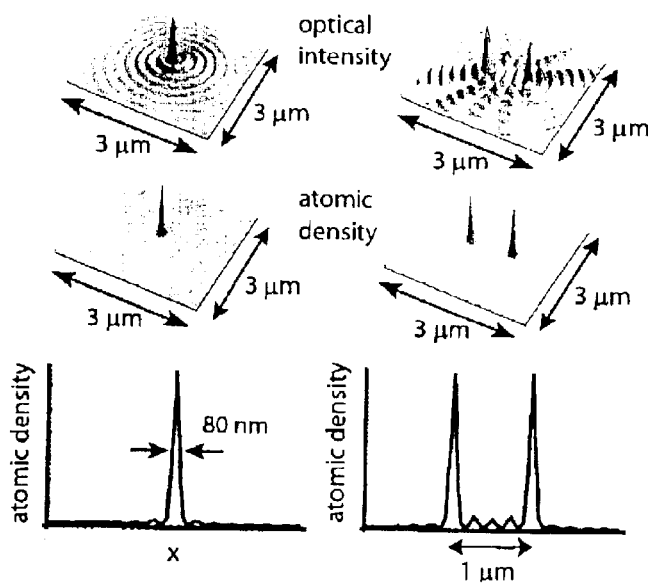
FIG. 6 are graphic illustrations of simulation data of one spot and two spot distributions for $\lambda=425$ nm, $U_{max}/k_B=100$ $\mu$K, and T=20 $\mu$K.

FIG. 6 shows some examples of simulations of synthesized spots using sixty-four plane wave components uniformly distributed on the circle. It should be noted that the intensity distribution due to a finite number of discrete plane waves is aperiodic in space, so that a ring of secondary peaks appears at a certain radius from the origin. By using sufficiently many plane wave components, the radius of the secondary ring can be made larger than the region of interest, which in this example is the 3000×3000 nm square shown in the figure. In the left hand portion of FIG. 6, a centered single spot is shown. The position of the spot can be shifted by adding phase offsets to the plane waves, or, as shown in the right hand portion, two or more spots can be generated using phase shifted sets of waves. As with periodic atomic lithography, the localization of a well collimated atomic beam in the thick lens limit can be much sharper than the spread of the optical intensity. As is seen in the graphs at the bottom row, the atomic distribution in a single spot has a FWHM (full width at half maximum) of approximately 80 nm for potential wells 5 times deeper than the transverse atomic temperature.

A single bright spot can be used to write an arbitrary pattern by translating the substrate or translating the spot. Here, the spot can be translated without mechanical motion by adding appropriate phase shifts to the spatial light modulators. Although this serial mode of writing may be slower than optical or atomic projection lithography, it may not be possible to achieve high speed and maximum resolution simultaneously. Approaches to high resolution next generation lithography based on e-beam or ion-beam techniques may also be limited to a serial writing mode due to space charge limitations.

The sharply defined bright spots illustrated in FIG. 6 are not created by focusing of a single beam, but by interference of a large number of plane waves, each of which illuminates the entire region. The role of the lenses 40, 41, 42, and 43 shown in FIG. 4 is to tilt the beamlet passing through each pixel of the spatial light modulators 35, 36, 37 and 38, respectively, towards the center of the image region, but the lenses 40–43 do not tightly focus each beamlet. Outside of the bright spots destructive interference leads to a low background light level. From the point of view of Fourier optics, focusing of a beam can also be described in terms of interference of the constituent plane wave components, taking into account relative phase shifts due to propagation. One advantage to the approach to image synthesis utilized here is that the phases of each of the plane wave components can be directly controlled.

Figure 7:
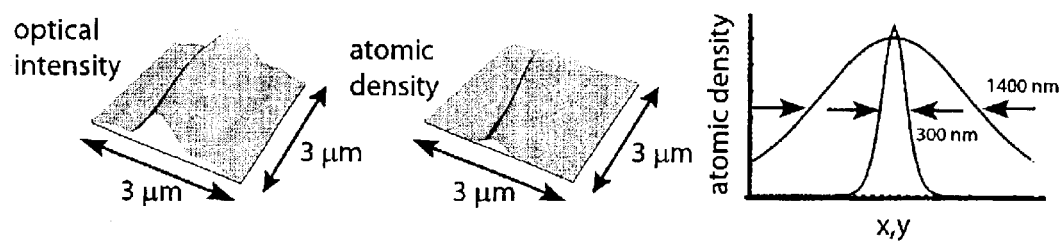
FIG. 7 are graphic illustrations of simulation data of line formations for Cs, $\lambda=852$ nm, and $U_{max}/k_BT=5$.

In some cases, it is advantageous not to use the full $2\pi$ angular range, for example, if the user wants to write a single straight line segment. FIG. 7 shows the result of illuminating just one of the modulators in FIG. 9 to create a bundle of 24 beamlets. For the parameters used, a width of 300 nm with a length of 1400 nm (FWHM) can be obtained. Several parallel lines can also be displaced relative to each other using phase offsets in a manner analogous to that shown for spots in FIG. 6. A similar line segment could also be created by focusing a single Gaussian beam. The difference is that for the same FWHM atomic line width of 300 nm using a Gaussian beam, a FWHM length of only 550 nm can be achieved. The much shorter length and reduced aspect ratio with a Gaussian beam is due to its much greater divergence than the bundle of beamlets.

Determining the optimum illumination to synthesize a desired pattern is an inverse problem. Since optical waves add linearly, if a delta function is synthesized, displaced delta functions can be added to generate an arbitrary distribution. There are several apparent limitations to this. First, spatial light modulators have finite dynamic range, so there is a practical limit to superposition. Second, as is seen in FIG. 6, a perfect delta function cannot be synthesized, but it is possible to synthesize a sharply localized peak with a weak ring structure about it. When multiple spots are superposed, the rings interfere, leading to crosstalk. In practice, there is therefore an optimum illumination distribution that minimizes the error between the desired pattern and the actual structure that is generated.

The problem can be described mathematically by noting that the field in the region between the lenses 40–43 in FIG. 4 satisfies the 2D Helmholtz equation if the field is assumed constant along the z axis. A solution at an arbitrary interior point P can be written as $$u(P) = -\frac{i}{4}\int_0^{2\pi} ds \left[ u(s)\frac{\partial H_0^{(1)}(kr_1)}{\partial n} - H_0^{(1)}(kr_1)\frac{\partial u(s)}{\partial n} \right]$$

where s parameterizes the boundary, $H_0^{(1)}$ is a Hankel function, k is the optical wavenumber, $r_1$ is the distance from P to a point on the boundary, and n is an outward normal unit vector. Alternatively, the equation can be written in terms of the boundary values only, without field derivatives, using the 2D Green's function. Given the boundary values U(S), the field at any interior point can be calculated by integrating $$u(P) = -\frac{i}{4}\int_0^{2\pi} ds \left[ u(s)\frac{\partial H_0^{(1)}(kr_1)}{\partial n} - H_0^{(1)}(kr_1)\frac{\partial u(s)}{\partial n} \right].$$

Figure 8:
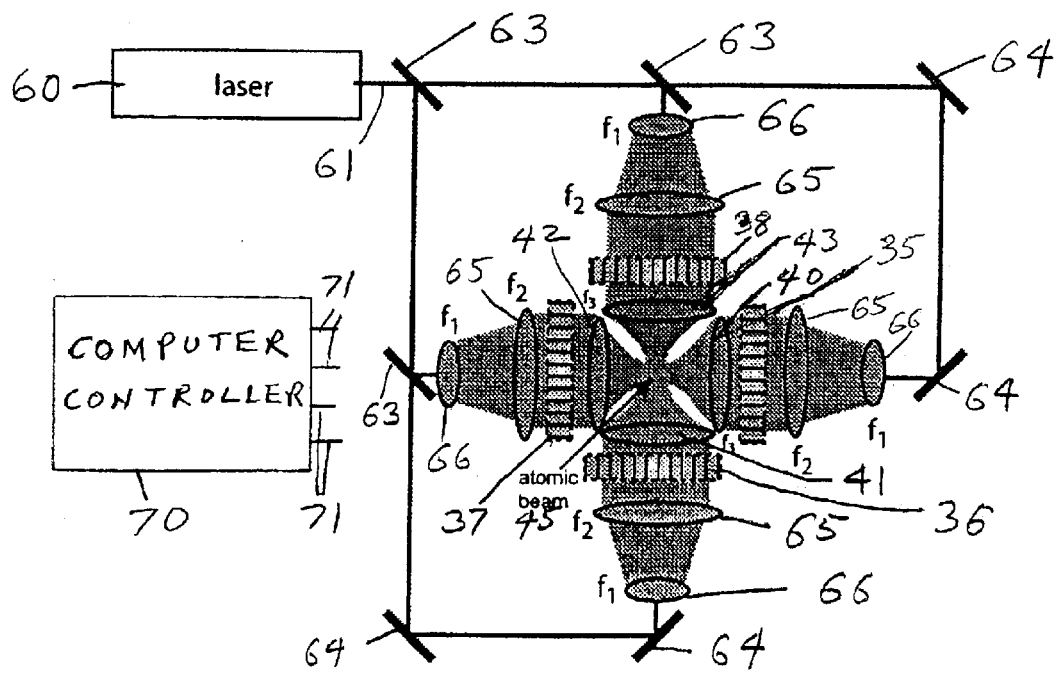
FIG. 8 is a schematic view of a two-dimensional atomic lithography system in accordance with the invention.

A more detailed optical layout for two-dimensional atomic lithography in accordance with the invention is shown in FIG. 8. The atomic beam 45 is taken to propagate perpendicular to the plane of the figure through the center of the figure. A laser 60 provides an output beam 61 which is split by beamsplitters 63 and mirrors 64 into four equal intensity beams that are each magnified by a factor $f_2/f_1$ by lenses 65 and 66. The magnified beams are sent through four perpendicularly oriented linear spatial light modulators 35, 36, 37 and 38, each of which have p pixels. After the spatial light modulators, the beams are focused into the atomic beam by lenses 40, 41, 42 and 43 of focal length $f_3$ and intersect or converge above the substrate surface. The modulators 35–38 are controlled by a computer controller 70 connected to the modulators by control lines 71.

Typical values for the focal lengths of the lenses can be estimated as follows. The beam exiting the laser 60 will have a characteristic width of $w_1=1$ mm. Taking $f_1=10$ mm and $f_2=100$ mm gives a magnification factor of 100/10=10 and a beam width of $W_2=10$ mm at each spatial light modulator. A final focusing lens of $f_3=100$ mm will then give a characteristic width of the focused beams of $W_3=\lambda f_3/(\pi W_2)=2.7$ $\mu$m. This is the same order of magnitude as the 3×3 $\mu$m region shown in numerical calculations of the generated spot patterns of FIGS. 6 and 7. This region defines the total area over which individual spots can be generated.

The (much smaller) size and position of a single bright spot is determined by the phases on the spatial light modulator under the control of the computer 70, which is programmed to control the modulators as discussed below.

Figure 9:
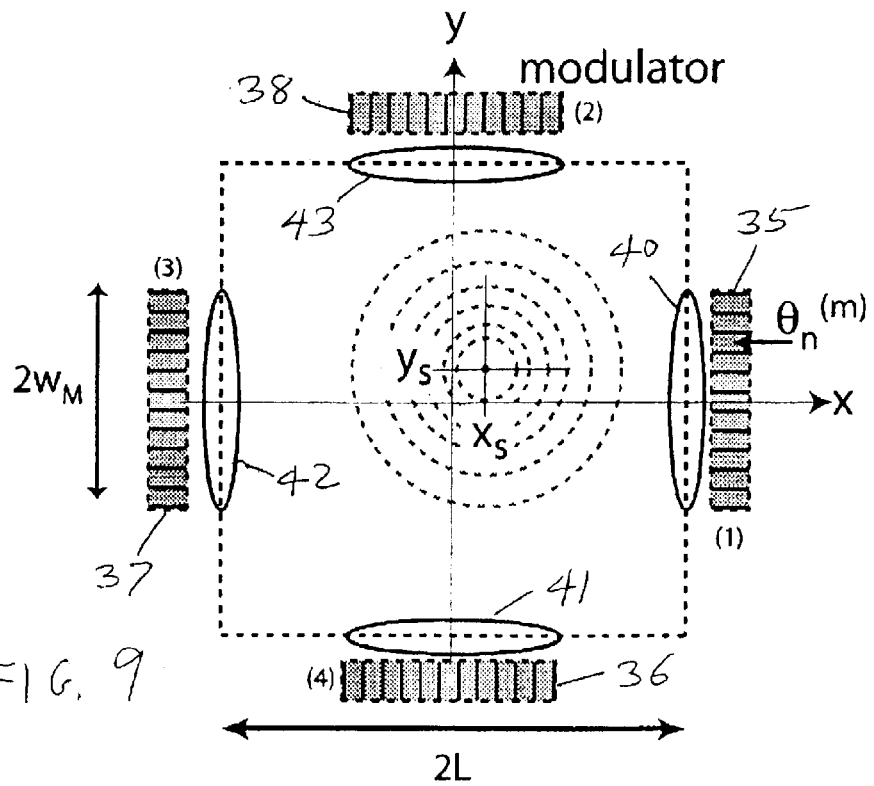
FIG. 9 is an illustrative view of a portion of the lithography system of FIG. 8 showing a coordinate system for modulator phases.

Define an x–y coordinate system as shown in FIG. 9 that is centered on the atomic beam. The center of the lens 40 to the right of the atomic beam in FIG. 9 is then at X=L, Y=0. If the modulator of total width $2w_m$ is divided into p pixels numbered from $0 \to p-1$, then the coordinate of the $n^{th}$ pixel is at $$x_n = L, \quad y_n = w_m\left[\frac{2n-(p-1)}{p-1}\right].$$

Denoting the four modulators by superscripts 1–4, with the modulator 35 to the right being 1 and proceeding in the counterclockwise direction, we have for the $n^{th}$ pixel on each modulator:

$$x_n^{(1)} = L, \quad y_n^{(1)} = w_m\left[\frac{2n-(p-1)}{p-1}\right] \quad (1)$$

$$x_n^{(2)} = w_m\left[\frac{2n-(p-1)}{p-1}\right], \quad y_n^{(2)} = L \quad (2)$$

$$x_n^{(3)} = -L, \quad y_n^{(3)} = -w_m\left[\frac{2n-(p-1)}{p-1}\right] \quad (3)$$

$$x_n^{(4)} = w_m\left[\frac{2n-(p-1)}{p-1}\right], \quad y_n^{(4)} = -L \quad (4)$$

If we wish to create a bright spot at the center of the atomic beam (x=y=0), then no phase shifts should be applied to the modulators. The phases at pixel n of modulator m are therefore $\phi_n^{(m)}=0$. This assumes that the lenses 40–43 are perfectly corrected for aberrations. Imperfections in the lenses due, for example, to spherical aberrations, can be corrected for by adding static bias phases $\phi_n^m = -\epsilon_n$ to each modulator pixel, where $\epsilon_n$ is the average phase error due to the lens at pixel n.

We now wish to scan the bright spot by adjusting the pixel phases. To calculate the needed phases, assume we are creating a spot at position $x_s,y_s$. A circular wave expanding from this point has the phase structure $$\theta(x,y) = k[(x-x_s)^2 + (y-y_s)^2]^{\frac{1}{2}}$$

where $k=2\pi/\lambda$ is the wavenumber of the light at wavelength $\lambda$. The phase of the expanding wave at pixel n on modulator m is $$\theta_n^{(m)}(x_s,y_s) = k\left[x_n^{(m)} - x_s)^2 + y_n^{(m)} - y_s)^2\right]^{\frac{1}{2}}.$$

Thus in order to produce a spot at $x_s,y_s$ we simply add the phase $-\theta_n^{(m)}(x_s,y_s)$ to each pixel.

Note that the calculated phase uses the offset L to the lenses 40–43, and not to the modulators 35–38. Since propagation between each modulator and its adjacent lens is parallel to the x or y axis, there is only an overall phase offset that needs to be added to ensure that the converging waves coming from different modulators are in phase when they meet at x=y=0. Denoting this overall phase offset of modulator m as $\theta_0^{(m)}$ we get $$\theta_0^{(m)} - \theta_n^{(m)}(x_s,y_s) = \theta_0^{(m)} - k\left[(x_n^{(m)} - x_s)^2 + (y_n^{(m)} - y_s)^2\right]^{\frac{1}{2}}$$

for the phase shift at each pixel needed to create a spot at coordinates $x_s,y_s$. The modulator offset phases $\theta_0^{(m)}$ due to imperfections in the mechanical layout are independent of the spot location and should be determined from an in-situ measurement of the optical system.

It should be understood that the invention is not limited to the embodiments set forth herein as illustrative, but embraces all such forms thereof as come within the scope of the following claims.

What is claimed is:

1. A method of depositing atoms on a substrate, the method comprising:
   (a) forming an atomic beam and directing the atomic beam toward a surface of a substrate;
   (b) providing a laser beam;
   (c) passing the laser beam through at least one spatial light modulator; and
   (d) controlling the at least one spatial light modulator to modulate the laser beam to form by interference at least one high optical intensity spot above the surface of the substrate through which the atomic beam is passed to focus the atomic beam to at least one spot on the surface of the substrate.

2. The method of claim 1 wherein the laser beam is passed through four perpendicularly oriented linear spatial light modulators to form four optical beams intersecting over the substrate surface.

3. The method of claim 2 wherein the optical beams from the modulators are passed through lenses to focus the optical beams into a region above the surface of the substrate.

4. The method of claim 3 wherein the spatial light modulators adjust the phases of the optical beams.

5. The method of claim 3 further comprising creating a two-dimensional lithographic pattern of atoms deposited from the atomic beam onto the substrate by translation of the at least one optical spot using the spatial light modulators.

6. The method of claim 3 further comprising creating an arbitrary two-dimensional lithographic pattern of atoms deposited from the atomic beam on the substrate by creation of a spot using the spatial light modulators combined with translation of the substrate.

7. An atomic lithography system for forming two-dimensional nanostructures on a substrate comprising:
(a) a laser providing an output beam;
(b) at least one spatial light modulator having a linear array of controllable pixels that receives the laser output beam; and
(c) lenses positioned proximate the at least one spatial light modulator, the lenses and the at least one spatial light modulator configured to form at least one high intensity optical spot by interference above a surface of a substrate that can selectively focus atoms in an atomic beam onto the substrate.

8. The system of claim 7 wherein there are four spatial light modulators, and further comprising mirrors arranged to distribute the laser beam to the spatial light modulators.

9. The system of claim 7 wherein the lenses and spatial light modulators are controllable to selectively focus atoms from an atomic beam onto a substrate in a two-dimensional pattern.

10. The system of claim 7 further including a source of atoms that provides a beam of atoms directed toward the substrate.

11. The system of claim 7 wherein there are four perpendicularly oriented spatial light modulators through which the beam from the laser is passed.

12. The system of claim 11 including lenses through which the beams from the modulators are passed to focus the beams from each modulator into a region above the substrate.

13. An atomic deposition system comprising:
(a) means for forming an atomic beam and directing it toward a surface of a substrate; and
(b) means for directing a laser beam above the surface of the substrate to form a high intensity optical spot by interference that is not part of a periodic array to selectively focus the atomic beam by the optical spot.

14. The system of claim 13 wherein the means for directing a laser beam includes means for transversely projecting the laser beam into four optical beams that converge above the surface of the substrate to form a high intensity optical spot by interference.

15. The system of claim 14 wherein the means for directing a laser beam includes means for adjusting the phases of the optical beams.

* * * * *